United States Patent
Naylor et al.

(10) Patent No.: US 11,830,788 B2
(45) Date of Patent: Nov. 28, 2023

(54) INTEGRATED CIRCUITS AND METHODS FOR FORMING INTEGRATED CIRCUITS

(71) Applicant: Intel Corporation, Santa Clara, CA (US)

(72) Inventors: Carl Naylor, Hillsboro, OR (US); Ashish Agrawal, Hillsboro, OR (US); Urusa Alaan, Hillsboro, OR (US); Christopher Jezewski, Portland, OR (US); Mauro Kobrinsky, Portland, OR (US); Kevin Lin, Beaverton, OR (US); Abhishek Anil Sharma, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 101 days.

(21) Appl. No.: 17/303,270

(22) Filed: May 25, 2021

(65) Prior Publication Data

US 2021/0351105 A1    Nov. 11, 2021

Related U.S. Application Data

(63) Continuation of application No. 16/221,815, filed on Dec. 17, 2018, now Pat. No. 11,164,809.

(51) Int. Cl.
*H01L 23/40*    (2006.01)
*H01L 21/822*   (2006.01)
*H01L 23/532*   (2006.01)
*H01L 27/12*    (2006.01)
*H01L 21/70*    (2006.01)

(52) U.S. Cl.
CPC ........ *H01L 23/4012* (2013.01); *H01L 21/707* (2013.01); *H01L 21/8221* (2013.01); *H01L 23/5329* (2013.01); *H01L 27/1222* (2013.01)

(58) Field of Classification Search
CPC ............... H01L 23/4012; H01L 21/707; H01L 21/8221; H01L 23/5329; H01L 29/78618; H01L 27/124; H01L 27/1222–1233; H01L 27/127–1285; H01L 2224/291–29184; H01L 29/495–4958
See application file for complete search history.

(56) References Cited

U.S. PATENT DOCUMENTS 10,607,938 B1 *   3/2020   Rubin ............ H01L 21/823475
2017/0033003 A1 * 2/2017   Song ..................... H01L 29/45

OTHER PUBLICATIONS

Cho, Suyeon, et al., Phase Patterning for Ohmic Homojunciton Contact in MoTe2, Science (vol. 349, Issue 6248 (Aug. 7, 2014)).
Kappera, Rajesh et al., Phase-Engineered Low-Resistance Contacts for Ultrathin MoS2 Transistors, Nature Materials (vol. 13 (Dec. 2014)).

* cited by examiner

*Primary Examiner* — Shahed Ahmed
(74) *Attorney, Agent, or Firm* — 2SPL Patent Attorneys PartG mbB; Kieran O'Leary (57) ABSTRACT

An example relates to an integrated circuit including a semiconductor substrate, and a wiring layer stack located on the semiconductor substrate. The integrated circuit further includes a transistor embedded in the wiring layer stack. The transistor includes an embedded layer. The embedded layer has a thickness of less than 10 nm. The embedded layer includes at least one two-dimensional crystalline layer including more than 10% metal atoms. Further examples relate to methods for forming integrated circuits.

6 Claims, 8 Drawing Sheets

INTEGRATED CIRCUITS AND METHODS FOR FORMING INTEGRATED CIRCUITS

CROSS-REFERENCE TO RELATED APPLICATION

This application is a continuation of U.S. application Ser. No. 16/221,815, filed on Dec. 17, 2018. The contents of the earlier filed application is incorporated by reference herein in its entirety.

FIELD

Examples of the present disclosure relate to integrated circuits, and to methods for forming integrated circuits.

BACKGROUND

The continuous development of semiconductor technology leading to smaller structures requires new functional and small scaled semiconductor structures, e.g. structures in integrated circuits, as well as improved semiconductor processes.

However, temperature limitations, for example in back end of line processes due to structures of an integrated circuit already formed, may impede integration of required semiconductor structures in integrated circuits. Further, complex semiconductor processes increase a required time for forming integrated circuits and therefore increase manufacturing costs.

BRIEF DESCRIPTION OF THE FIGURES

Some examples of apparatuses and/or methods will be described in the following by way of example only, and with reference to the accompanying figures, in which.

DETAILED DESCRIPTION

Various examples will now be described more fully with reference to the accompanying drawings in which some examples are illustrated. In the figures, the thicknesses of lines, layers and/or regions may be exaggerated for clarity.

Accordingly, while further examples are capable of various modifications and alternative forms, some particular examples thereof are shown in the figures and will subsequently be described in detail. However, this detailed description does not limit further examples to the particular forms described. Further examples may cover all modifications, equivalents, and alternatives falling within the scope of the disclosure. Same or like numbers refer to like or similar elements throughout the description of the figures, which may be implemented identically or in modified form when compared to one another while providing for the same or a similar functionality.

It will be understood that when an element is referred to as being "connected" or "coupled" to another element, the elements may be directly connected or coupled or via one or more intervening elements. If two elements A and B are combined using an "or", this is to be understood to disclose all possible combinations, i.e. only A, only B as well as A and B, if not explicitly or implicitly defined otherwise. An alternative wording for the same combinations is "at least one of A and B" or "A and/or B". The same applies, mutatis mutandis, for combinations of more than two Elements.

The terminology used herein for the purpose of describing particular examples is not intended to be limiting for further examples. Whenever a singular form such as "a," "an" and "the" is used and using only a single element is neither explicitly or implicitly defined as being mandatory, further examples may also use plural elements to implement the same functionality. Likewise, when a functionality is subsequently described as being implemented using multiple elements, further examples may implement the same functionality using a single element or processing entity. It will be further understood that the terms "comprises," "comprising," "includes" and/or "including," when used, specify the presence of the stated features, integers, steps, operations, processes, acts, elements and/or components, but do not preclude the presence or addition of one or more other features, integers, steps, operations, processes, acts, elements, components and/or any group thereof.

Unless otherwise defined, all terms (including technical and scientific terms) are used herein in their ordinary meaning of the art to which the examples belong.

Figure 1:
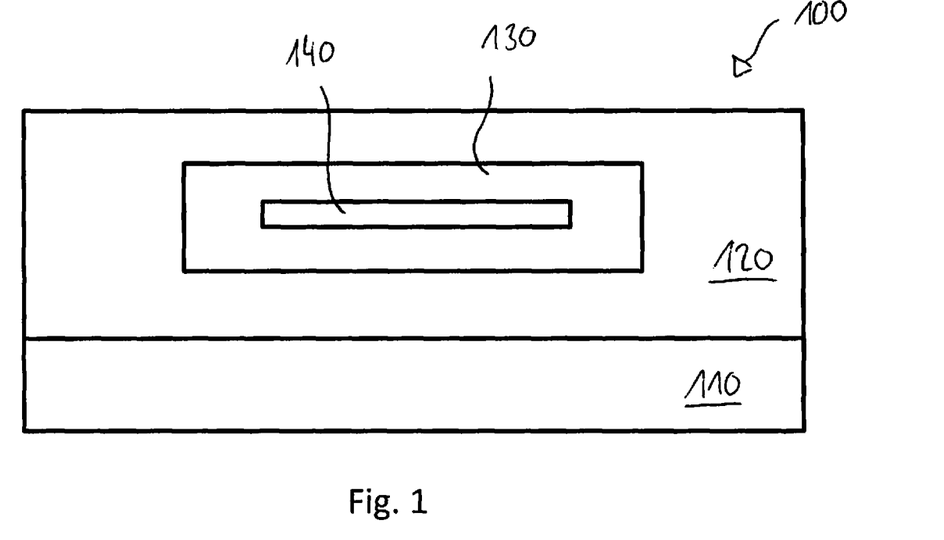
FIG. 1 shows an example of an integrated circuit with a transistor embedded in a wiring layer stack.

FIG. 1 shows a schematic cross section of an integrated circuit 100 with a transistor 130 embedded in a wiring layer stack 120.

The integrated circuit 100 comprises the transistor 130. For example, the transistor 130 is embedded in the wiring layer stack 120. The transistor 130 comprises an embedded layer 140. The embedded layer 140 may have a thickness of less than 10 nm. For example, the embedded layer 140 may comprise at least one two-dimensional crystalline layer. For example, a portion of the embedded layer 140 may have a crystalline structure. The two-dimensional crystalline layer may comprise more than 10% metal atoms (or more than 20% of metal atoms), for example. The integrated circuit 100 may comprise a semiconductor substrate 110. The wiring layer stack 120 may be located on the semiconductor substrate 110.

For example a thickness of the embedded layer 140 may be smaller than 10 nm (or smaller than 5 nm, smaller than 3 nm or smaller than 2 nm). For example, the thickness of the embedded layer 140 may be an average thickness along the embedded layer 140 or a maximum thickness. For example, the embedded layer 140 may comprise a plurality of two-dimensional layers, e.g. monolayers. A two-dimensional monolayer may be a layer comprising only one layer of the crystalline material. Alternatively, a two-dimensional monolayer may be a layer comprising only one molecular layer (e.g. molybdenum disulfide $MoS_2$). For example, the number of the monolayers of the embedded layer 140 may be smaller than 20 (or smaller than 10, smaller than 8, or smaller than 5). A two-dimensional monolayer may have a thickness of less than 1 nm (or less than 0.8 nm).

For example, the embedded layer 140 may be a thin film crystal layer (e.g. a transition metal dichalcogenide TMD layer). Accordingly, the transistor 130 in the wiring layer stack may be referred to as thin film crystal transistor. The wiring layer stack 120 may comprise further transistors, for example in the same layer or in other layers below the transistor 130. The wiring layer stack 120 may comprise a plurality of thin film crystal transistors 130.

Further, the wiring layer stack may comprise wiring structures (e.g. lines and vias) to connect the transistor or the plurality of transistors to a semiconductor substrate and/or in/out (I/O) interfaces (e.g. pads) of the integrated circuit.

Providing the thin film crystal transistor 130 in the wiring layer stack 120 of the integrated circuit 100 may enable an increased transistor density and/or the possibility of a 3D stacking of transistors within the integrated circuit 100. For example, compared to providing other transistors, by providing the thin film crystal transistor 100 (or a plurality of thin film crystal transistors 100, e.g. in a processing device), volume of the integrated circuit 100 may be reduced and/or efficiency of the integrated circuit 100 may be increased.

For example, a first portion of the thin film crystal layer may be a channel region of the transistor 130. A lateral center region of the thin film crystal may be the channel region of the transistor 130. Providing the thin film crystal as channel region may reduce leakage current of the transistor 130, for example. For example, short channel effects may be reduced when using the thin film crystal as channel material. Reducing short channel effects may enable to reduce a gate length of the transistor 130 (e.g. to less than 5 nm, or less than 3 nm), without resulting in short channel effects as they may occur in other transistors. Smaller dimensions of the channel region and/or gate of the transistor 130 may further increase package density of the integrated circuit 100, for example.

For example, at least the first portion (e.g. the channel region of the transistor 130) of the thin film crystal layer (e.g. the embedded layer 140) has a first crystal phase. The first crystal phase may be an H-phase, e.g. a semiconducting hexagonal crystal structure. The first crystal phase may be a 1H-phase or a 2H-phase, for example. For example, at least 70% (or at least 80%, at least 90% or at least 99%) of material of the first portion may have the first crystal phase.

For example, a second portion of the thin film crystal layer may be a source region of the transistor 130 (and/or a drain region of the transistor 130). For example, the second portion of the thin film crystal layer may have a second crystal phase differing from the first crystal phase. The second crystal phase may be a T-phase (e.g. a 1T-phase or 1T'-phase), for example. For example, at least 70% (or at least 80%, at least 90% or at least 99%) of the material of the second portion may have a T-phase crystal structure. The T-phase crystal structure may be a metallic or semi metallic structure. For example, the embedded layer having a H-phase portion and a T-phase portion may be a $MoS_2$ layer or a $MoTe_2$ layer.

Providing the T-phase structure for the source region (and/or drain region) of the transistor 130 may reduce a contact resistance of the transistor 130. For example, a contact resistance between a source structure (and/or drain structure) of the transistor 130 and the thin film crystal may be low, e.g. compared to other devices where a source contact region has a H-phase structure. For example, providing the T-phase structure for achieving lower contact resistance may increase the efficiency of the integrated circuit 100 as power losses may be reduced.

The thin film crystal layer (e.g. the embedded layer 140) may comprise metal atoms. For example, the thin film crystal layer may comprise at least 10% (or at least 20%) of metal atoms. The metal atoms may be one of Sc, Ti, V, Cr, Mn, Fe, Co, Ni, Cu, Zn, Y, Zr, Nb, Mo, Tc, Ru, Rh, Pd, Ag, Cd, Hf, Ta, W, Re, Os, Ir, Pt, Au, Hg, Rf, Db, Sg, Bh, Hs, Mt, Ds, or Rg. For example, the metal atoms may be transition metal atoms. A transition metal may be any element in the d-block of the periodic table, for example. For example, the metal atoms may be molybdenum atoms.

For example, the thin film crystal layer may further comprise secondary atoms, for example at least 10% of secondary atoms. The secondary atoms may be chalcogens, for example. The secondary atoms may be one of S, Cl, H, O, Se, and Te atoms. For example, the secondary atoms may be S atoms or Te atoms.

Consequently, the thin film crystal layer may be a transition metal dichalcogenide TMD layer. A TMD material may have the formula $ME_2$, where M is a transition metal and E is a chalcogen, e.g. one of S, Se, and Te. For example, the thin film crystal layer may be a $MoS_2$ layer, or a $MoTe_2$ layer.

For example, the thin film crystal layer may further comprise at least 10% of tertiary atoms. For example, also the tertiary atoms may be chalcogens. For example, the tertiary atoms are one of S, Cl, H, O, Se, or Te atoms.

For example, a thin film crystal layer comprising metal atoms, secondary, and tertiary atoms may be a MAX phase layer. For example, MAX phases may refer to layered, hexagonal carbides and nitrides. MAX phases may have the general formula $M_{n+1}AX_n$, (MAX) with n being 1, 2, or 3; M being an early transition metal, for example; A being an A-group (for example IIIA and IVA, or groups 13 and 14) element; and X being either carbon and/or nitrogen, for example. For example, the thin film crystal layer may comprise one of $Ti_2SC$, $Ti_2CdC$, $Hf_2InC$, $Hf_2SSc$, or $Ti_3SiC_2$.

For example, the transistor 130 may comprise a gate dielectric and a gate electrode. The gate dielectric may be located on the first portion of the thin film crystal layer. For example, the gate electrode may be located on the gate dielectric. The gate dielectric may be a high-K dielectric material (e.g. hafnium oxide), for example.

For example, the transistor 130 may comprise a source metal structure (e.g. contact structure) located on the second portion of the thin film crystal layer. For example, the second portion may comprise two sub portions located adjacent to the first portion at opposite sides of the first portion. The source metal structure may be located at one side for electrically contacting a first sub portion and a drain metal structure may be located at the other side for contacting a second sub portion of the second portion of the thin film crystal layer.

The integrated circuit 100 may be a processor, a memory, a transmitter, or a receiver for example. For example, the integrated circuit 100 may be a microprocessor or a central processing unit CPU. For example, the integrated circuit 100 may be an RF device, e.g. a transceiver.

The transistor of the integrated circuit 100, e.g. the thin film crystal transistor, may be a field effect transistor, e.g. a MOSFET or a JFET. For example, the transistor of the integrated circuit 100 may be a bipolar transistor.

The semiconductor substrate may be a silicon substrate or a wide band gap substrate, for example. The wide band gap substrate may be a GaN substrate or a GaAs substrate, for example.

The wiring layer stack 120 may comprise lateral wiring layers and vertical wiring layers. A lateral wiring layer (e.g. metal layer of the layer stack of the integrated circuit) may be a layer for implementing lateral electrical connections between vertical electrical connections (vias) connecting lateral wiring layers. A vertical wiring layer (e.g. via layer of the layer stack of the integrated circuit) may be a layer for implementing vertical electrical connections (vias) between lateral wiring layers.

Figure 2:
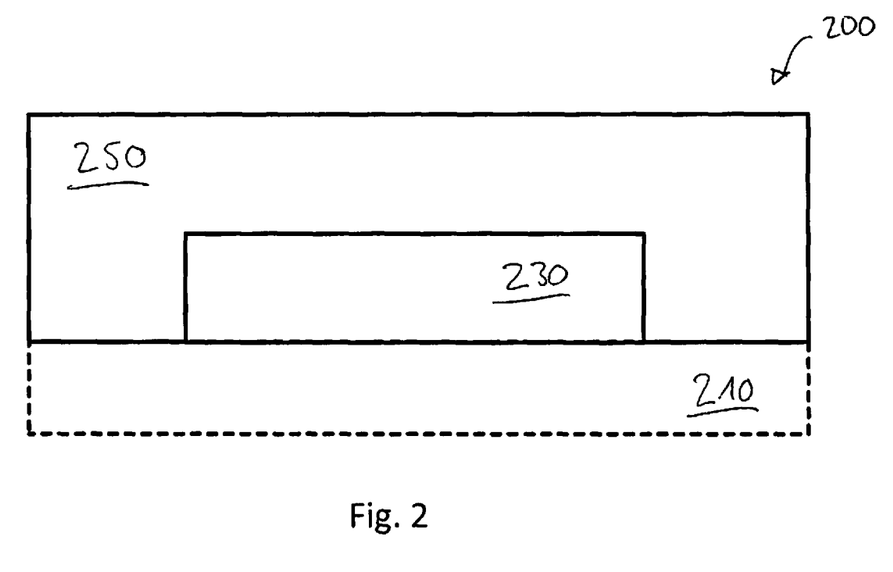
FIG. 2 shows an example of an integrated circuit with a thin film crystal transistor.

FIG. 2 shows a schematic cross section of an integrated circuit 200 with a thin film crystal transistor 230. The integrated circuit 200 comprises a plurality of thin film crystal transistors 230 on a substrate. Further, the integrated circuit 200 comprises an electrically insulating layer 250 located on a gate of the thin film crystal transistors 230. For example, the electrically insulating layer 250 may be located on a gate, on a drain region and on a source region of the plurality of thin film crystal transistors 230. For example, the substrate may be a semiconductor substrate (e.g. a silicon substrate) or a glass substrate.

For example, the electrically insulating layer 250 may be an inter-layer dielectric ILD layer (e.g. silicon oxide $SiO_x$ or silicon nitride) of the integrated circuit 200. The thin film crystal transistors 230 may be located in a layer of the integrated circuit 200 between two layers of a plurality of layers of the integrated circuit 200. By providing the thin film crystal transistors 230 within an inner layer of the integrated circuit 200, for example, a package density of the integrated circuit 200 may be increased. For example, compared to providing other transistors, by providing the thin film crystal transistor 200 (or a plurality of thin film crystal transistors 200, e.g. in a processing device) an efficiency of the integrated circuit 200 may be increased.

For example, the electrically insulating layer 250 may be located on a plurality of thin film crystal transistors 230 of the integrated circuit 200. The integrated circuit 200 may be a processing device, for example. Methods described below (e.g. in combination with FIGS. 6a-n and FIGS. 7a-m) show examples of forming thin film crystals using a scalable method at temperatures compatible with back end of line processes (e.g. below 400° C.). Using proposed methods may enable to form a plurality of thin film crystal transistors 230 in more than one layer of the integrated circuit 200, for example.

For example, the thin film crystal transistor 230 may be located on a further transistor of the integrated circuit 200. The further transistor may be a silicon transistor (e.g. a field effect transistor) or a further thin film crystal transistor 230, for example. For example, the further transistor may be located in the substrate (e.g. a semiconductor substrate), and a portion of the substrate may be a doped region of a further transistor of the integrated circuit. The doped region may be a drain region or a source region, for example.

More details and aspects are mentioned in connection with the embodiments described above or below. The embodiments shown in FIG. 2 may comprise one or more optional additional features corresponding to one or more aspects mentioned in connection with the proposed concept or one or more embodiments described above or below (e.g. FIGS. 1 and 3-8).

Figure 3:
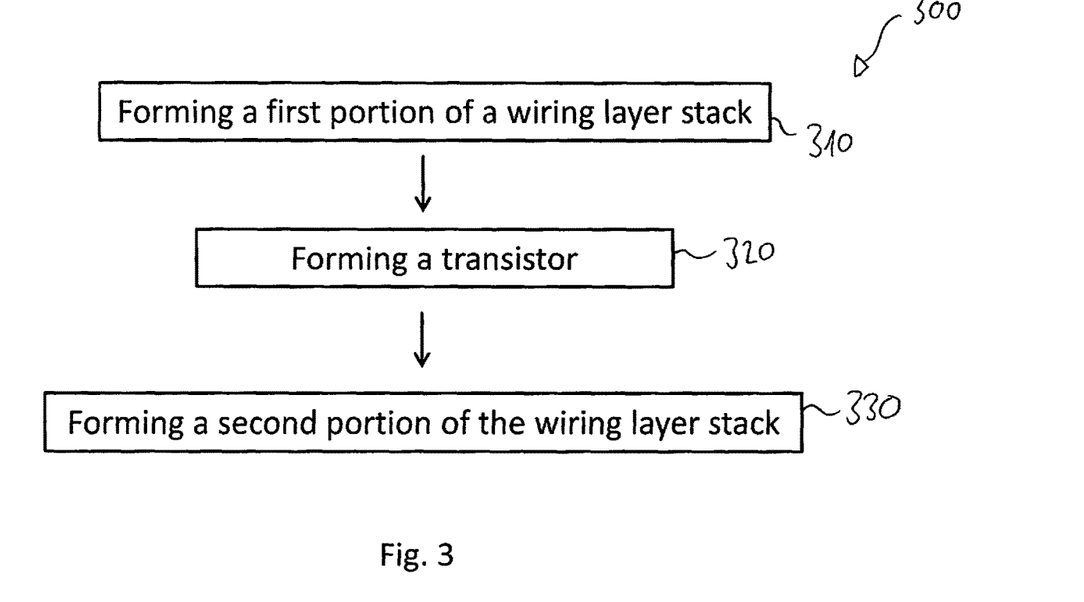
FIG. 3 shows an exemplary flow chart of a method for forming an integrated circuit with a wiring layer stack.

FIG. 3 shows an exemplary flow chart of a method 300 for forming an integrated circuit, e.g. comprising a wiring layer stack (for example according to an example as shown in combination with FIG. 1).

The method 300 for forming the integrated circuit comprises forming 310 a first portion of a wiring layer stack of the integrated circuit on a semiconductor substrate of the integrated circuit. The first portion of the wiring layer stack may comprise semiconductor structures (e.g. wiring structures and/or transistors) in a first level of the wiring layer stack, for example. Further, the method 300 comprises forming 320 a transistor on the first portion of the wiring layer stack. For example, forming 320 the transistor comprises forming an embedded layer of the transistor. For example, the embedded layer may have a thickness of less than 10 nm. For example, the embedded layer comprises at least one two-dimensional crystalline layer (e.g. monolayer) comprising more than 10% metal atoms. Further, the method 300 comprises forming 330 a second portion of the wiring layer stack so that the transistor is embedded in the wiring layer stack. The second portion of the wiring layer stack may comprise semiconductor structures (e.g. wiring structures and/or transistors) in a second level of the wiring layer stack, above the first level, for example. The embedded transistor may be located in the second level or in a level between the first level and the second level, for example.

For example, the embedded layer may be a thin film crystal layer. For example a thickness of the thin film crystal layer may be smaller than 10 nm (or smaller than 5 nm, smaller than 3 nm or smaller than 2 nm). A maximum thickness of the thin film crystal layer may be smaller than 10 nm.

For example, a first portion of the thin film crystal layer may be provided as a channel region of the transistor according to the method 300. Providing the thin film crystal as channel region may reduce leakage current of the transistor, for example. For example, short channel effects may be reduced when using the thin film crystal as channel material. Small dimensions of the thin film crystal transistor may enable to increase a package density of the integrated circuit to be formed, for example.

For example, the method 300 may further comprise converting the crystal phase of at least a portion of the thin film crystal layer. For example, the crystal phase may be converted by one of chemical treatment, laser treatment or electron beam treatment of the portion of the thin film crystal layer. The crystal structure of the thin film crystal material may convert due to the energy received by the respective portion of the thin film crystal layer.

For example, the crystal phase of the portion of the thin film crystal layer may be converted from an H-phase into a T-Phase. For example, at least 50% (or at least 70%, at least 90% or at least 95%) of the material of the portion of the thin film crystal layer may be converted from an H-phase into a T-phase.

For example, forming the thin film crystal layer may comprise forming a metal layer comprising at least a first and a second portion of different metals. Forming the thin film crystal layer may further comprise heating the metal layer in a gas atmosphere to transform the metal of the first portion into an H-Phase thin film crystal material and the metal of the second portion into a T-Phase thin film crystal material.

For example, the first portion may comprise Ta and the second portion may comprise Mo. By exposing both metals to $H_2S$, for example, a $TaS_2$ and a $MoS_2$ thin film crystal may be formed. For example, the $TaS_2$ may have the 1T-phase and $MoS_2$ may have the 1H (or 2H) phase. Accordingly, the method 300 may enable forming a heterojunction thin film crystal layer, for example (see also the examples shown in combination with FIGS. 6a to 6n).

For example, forming the thin film crystal layer may comprise forming first metal portions of a metal in a layer and transforming the metal of the first metal portions into thin film crystal material having an H-phase. Forming the thin film crystal layer may further comprise forming second metal portions of said metal in the layer next to the first metal portions and transforming the metal of the second metal portions into thin film crystal material having a T-phase. For example, the formed thin film crystal layer may have portions comprising the H-phase crystal material adjacent to portions comprising the T-phase crystal material. Accordingly, the method 300 may enable forming a heterojunction thin film crystal layer, for example (see also the examples shown in combination with FIGS. 7a to 7m).

For example, the method 300 may further comprise forming a gate dielectric of a gate of the transistor on the portion of the thin film crystal layer having the H-phase. The method 300 may comprise forming a gate electrode on the gate dielectric.

The method 300 may further comprise forming a source metal contact structure on a portion of the thin film crystal layer having the T-phase, for example. Providing the T-phase structure for a source region (and/or drain region) of the transistor may reduce a contact resistance of the transistor. For example, a contact resistance from the source metal contact structure (and/or drain metal contact structure) of the transistor to the thin film crystal may be low, e.g. compared to other devices where a source contact region has an H-phase structure. For example, providing the T-phase structure for achieving lower contact resistance may increase the efficiency of the integrated circuit to be formed as power losses may be reduced.

For example, forming the second portion of the wiring layer stack may comprise forming an electrically insulating layer on the gate of the transistor. The electrically insulating layer may be an ILD (e.g. silicon oxide) of the wiring layer stack. For example, the electrically insulating layer may be formed having a larger lateral extension than a lateral extension of the transistor.

More details and aspects are mentioned in connection with the embodiments described above or below. The embodiments shown in FIG. 3 may comprise one or more optional additional features corresponding to one or more aspects mentioned in connection with the proposed concept or one or more embodiments described above or below (e.g. FIGS. 1, 2 and 4-8).

Figure 4:
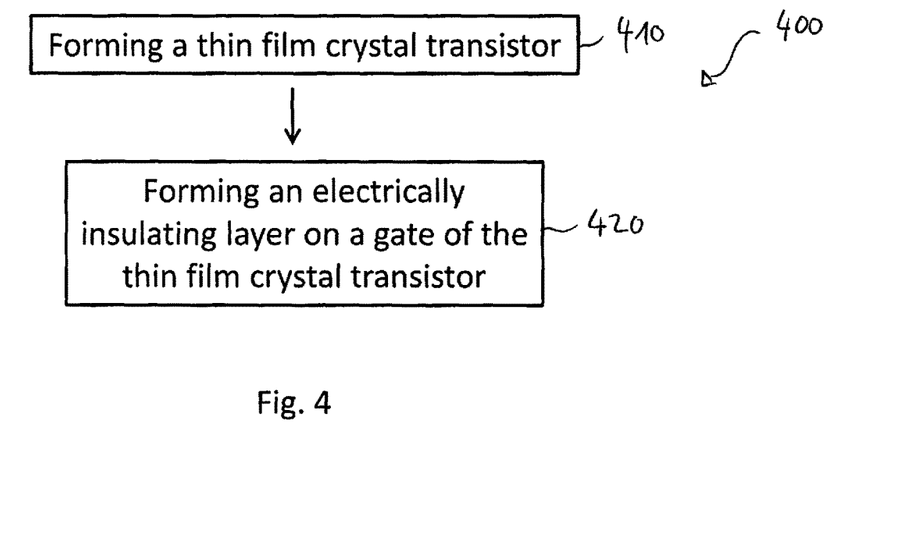
FIG. 4 shows an exemplary flow chart of a method for forming an integrated circuit with a thin film crystal transistor.

FIG. 4 shows an exemplary flow chart of a method 400 for forming an integrated circuit with a thin film crystal transistor.

The method 400 for forming an integrated circuit comprises forming 410 a thin film crystal transistor. Further, the method 400 comprises forming 420 an electrically insulating layer on a gate of the thin film crystal transistor.

For example, the method 400 may enable forming the thin film crystal transistor in different layers or in a layer stack o the integrated circuit. For example, short channel effects may be reduced when using thin film crystal as channel material of the thin film crystal transistor. Reducing short channel effects may enable to further reduce the dimensions of the thin film crystal transistor without effecting short channel effects as they may occur in other transistors. Smaller dimensions of the thin film crystal transistor may enable further increase of a package density of the integrated circuit to be formed according to the method 400, for example.

For example, the thin film crystal transistor may be formed on a dielectric structure of the integrated circuit, e.g. an inter-layer dielectric ILD. For example, also the electrically insulating layer formed on the thin film crystal transistor may be an ILD. For example, dielectric material may surround the formed thin film crystal transistor.

For example, the thin film crystal transistor may be formed above at least one further transistor structure of the integrated circuit. For example, a plurality of thin film crystal transistors may be formed above the further transistor structure.

For example, the thin film crystal transistor may comprise a thin film crystal layer, e.g. according to a thin film crystal layer as described above or below. For example, the thin film crystal layer may comprise a plurality of two-dimensional crystalline monolayers, for example less than 20 two-dimensional crystalline monolayers.

More details and aspects are mentioned in connection with the embodiments described above or below. The embodiments shown in FIG. 4 may comprise one or more optional additional features corresponding to one or more aspects mentioned in connection with the proposed concept or one or more embodiments described above or below (e.g. FIGS. 1 to 3 and 5a-8).

FIGS. 5a to 5i show an example of forming a transistor comprising converting a crystal structure of a thin film crystal layer. In FIGS. 5a to 5i, structures are shown in a cross-sectional side view. A transistor of the integrated circuit as shown in FIG. 1 and/or FIG. 2 may be formed as described in connection with FIGS. 5a to 5i.

Figure 5A:
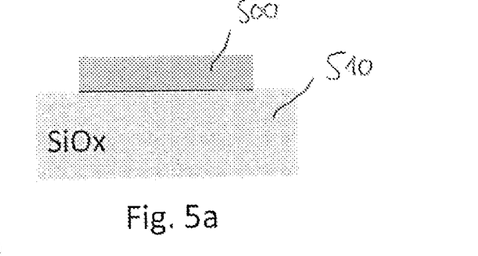
FIGS. 5*a*-5*i* show an example of forming a transistor comprising converting a crystal structure of a thin film crystal layer.

FIG. 5a shows a thin film crystal layer 500 located on an electrically insulating layer 510 (e.g. $SiO_x$). For example, the thin film crystal layer 500 may be a transition metal dichalcogenide TMD (e.g. molybdenum disulfide $MoS_2$ or molybdenum ditelluride $MoTe_2$). The thin film crystal layer 500 may be an H-phase material, for example. For example, the thin film crystal layer 500 may have a 1H-phase crystal structure (or a 2H-phase crystal structure). An H-phase structure may be a semiconducting hexagonal structure.

Figure 5B:
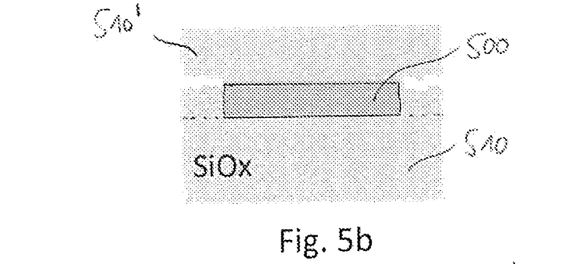

According to FIG. 5b, an ILD layer 510' is formed on the thin film crystal layer 500 so that the thin film crystal layer 500 is completely covered by insulating material, for example silicon oxide material.

Figure 5C:
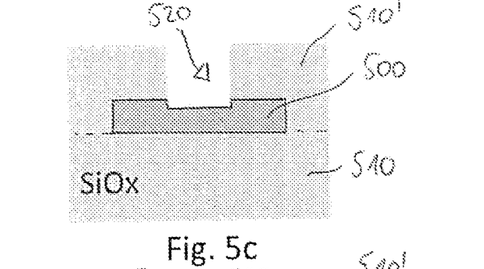

FIG. 5c shows gate patterning by forming a mask layer and structuring the ILD layer 510'. In a lateral center region of the thin film crystal layer 500, the ILD layer 510' is etched to uncover at least a top surface of the thin film crystal layer 500 so that a trench 520 is provided in the ILD layer 510. For example, also an upper portion of the thin film crystal layer 500 may be slightly etched within the center region.

Figure 5D:
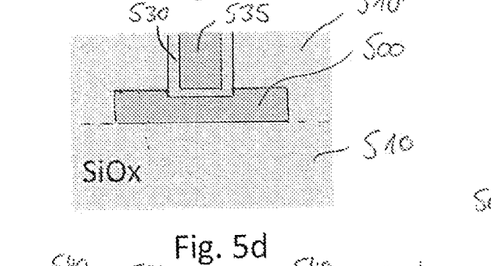

According to FIG. 5d, a gate structure of the transistor to be formed is provided. For example, a high-K dielectric material (e.g. hafnium oxide) is deposited onto the ILD layer 510' and into the trench 520 to cover the bottom and the side walls of the trench 520 and to form a gate insulation layer 530 on the thin film crystal layer 500. Further, a metal gate fill or polysilicon fill is formed in the trench to provide a gate electrode 535 on the gate dielectric 530. Afterwards, portions of the high-K dielectric material and the metal gate fill are removed and the surface is planarized (e.g. by chemical mechanical polishing CMP).

Further, a mask layer is formed on the ILD layer 510' for etching contact openings 540 into the ILD layer 510' at opposite sides of the gate structure. For example, surfaces of the thin film crystal layer 500 are uncovered (see FIG. 5e), for providing access to a drain region and a source region of the transistor to be formed.

Figure 5E:
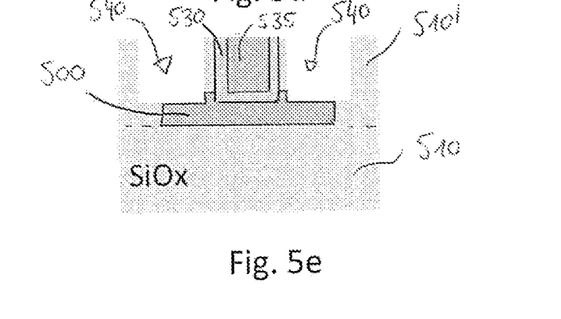

Before forming a source and a drain contact structure, the crystal structure of source and drain portions of the thin film crystal layer 500 being uncovered by the ILD layer 510' within the contact openings is converted. The phase conversion of the thin film crystal layer 500 may be achieved due to introducing energy into the thin film crystal material of the source and drain portions.

Figure 5F:
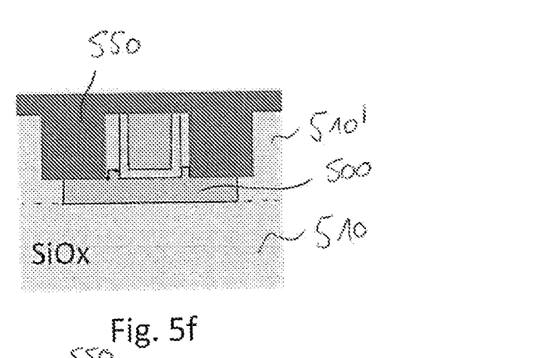

For example, as shown in FIG. 5f, the structure may be submerged in n-Butyllithium 550 (or another lithium chemical or lithium based liquid). Particularly, the contact openings 540 may be filled with the n-Butyllithium 550 so that the exposed portions of the thin film crystal layer 500 are in contact with the n-Butyllithium 550.

Figure 5G:
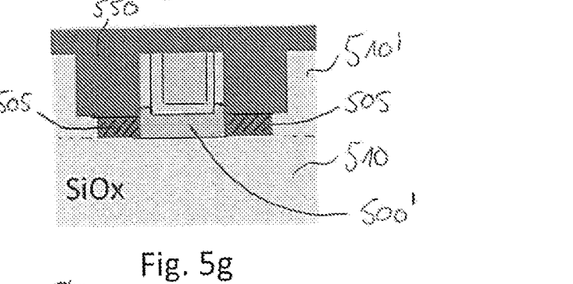

In this example, exposing the crystal material of the thin film crystal layer 500 to n-Butyllithium 550 causes a transformation of the crystal phase within the exposed regions. As shown in FIG. 5g, due to the chemical treatment of the exposed portions, T-phase source and drain portions 505 of the thin film crystal are formed. The crystal structure of the portions of the thin film crystal layer 500 exposed to the n-Butyllithium 550 is converted from the H-phase to the T-phase. A laterally centered portion 500' of the thin film crystal layer (e.g. located adjacent to the gate structure) still has the H-phase structure after treating the formed structure with n-Butyllithium 550.

Figure 5H:
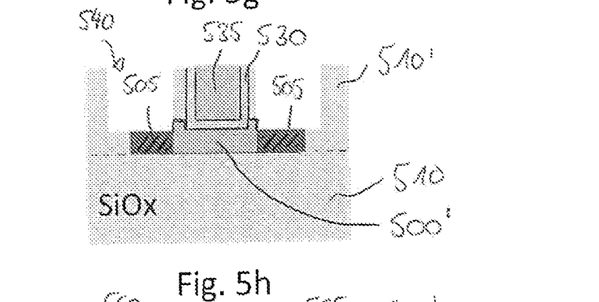

As shown in FIG. 5h, the n-Butyllithium 550 is removed to enable access to the T-phase source and drain portions 505 of the thin film crystal layer. The T-phase source and drain portions 505 may provide metallic properties and may enable low contact resistance to a source structure and to a drain structure, for example.

Figure 5I:
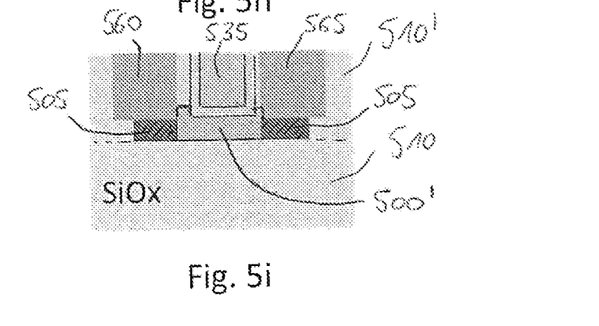

Subsequently, according to FIG. 5i, a source and a drain contact structure are formed, for example by depositing metal in the contact openings and planarizing the surface. A first metal structure 560 may be a drain contact structure of the transistor and a second metal structure 565 may be a source contact structure of the transistor. Further, a top surface of the shown structure comprising the formed thin film crystal transistor may be polished to provide a flat surface of the structure above the thin film crystal layer 500.

For example, as the thin film crystal layer 500 (comprising the source and drain portions with the converted crystal phase) is a substantial part of the transistor, the formed transistor may be referred to as thin film crystal transistor.

Other concepts may lower the contact resistance of the thin film crystal or thin film crystal transistor by doping of the contact regions of the thin film crystal, side contacts, and/or choice of a correct metal contact (e.g. a suitable metal-crystal combination). However, by providing the converted phase at the contact regions of the thin film crystal, a contact resistance to a metal contact may be further lowered.

By utilizing thin film crystals of different phases and properties, it may be possible to provide or create a very low contact resistance to the thin film crystal of interest. Integration of thin film crystals into semiconductor technology may be gated by high contact resistance. For example, proposed concepts may enable next generation electronics based of thin film crystals as contact resistance may be a bottleneck when using thin film crystals.

The concept proposed according to FIGS. 5a to 5i may enable to minimize thin film crystals contact resistance and to maximize device performance. An example of contact metal engineering to minimize the resistance is shown. The contact regions may be chemically treated to convert them from a 1H (or 2H) to a 1T or 1T' structure. Consequently, the semiconducting region may be turned into a metallic (or semi metallic) region. FIGS. 5a to 5i show an example of phase engineering through chemical treatment of a specific region.

More details and aspects are mentioned in connection with the embodiments described above or below. The embodiments shown in FIGS. 5a to 5i may comprise one or more optional additional features corresponding to one or more aspects mentioned in connection with the proposed concept or one or more embodiments described above or below (e.g. FIGS. 1 to 4 and 6a-8).

Figure 6A:
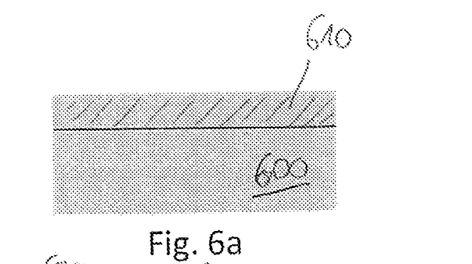
FIGS. 6*a*-6*n* show an example of forming a heterojunction crystal structure, and forming a thin film crystal transistor using the heterojunction crystal structure.
Figure 6B:
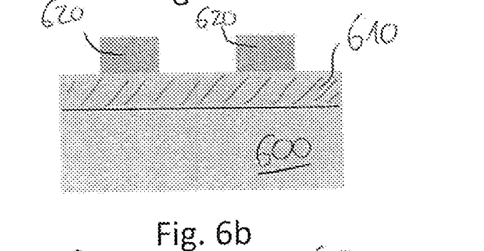
Figure 6C:
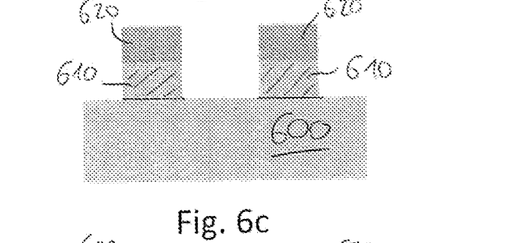
Figure 6D:
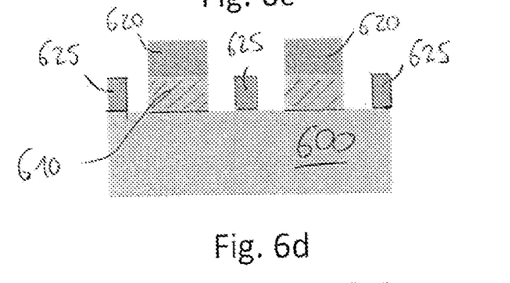
Figure 6E:
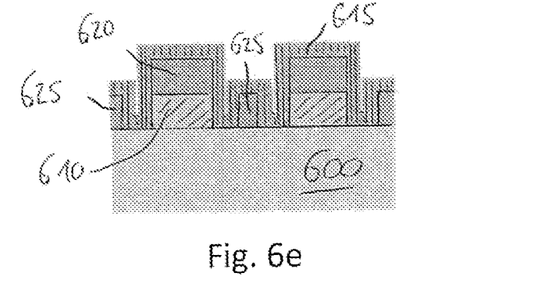
Figure 6F:
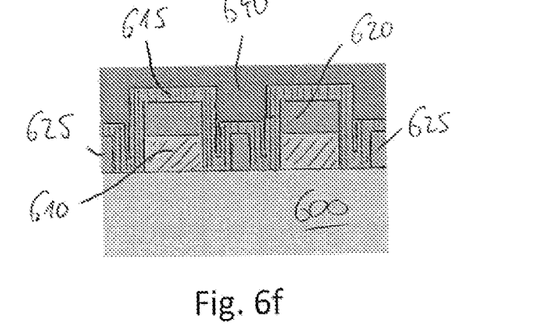
Figure 6G:
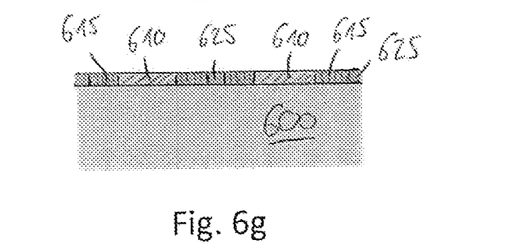
Figure 6H:
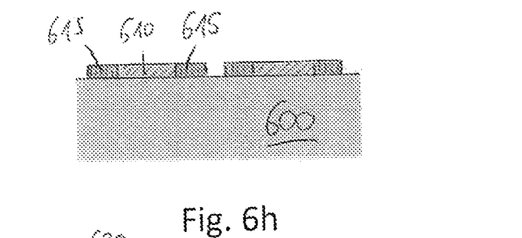
Figure 6I:
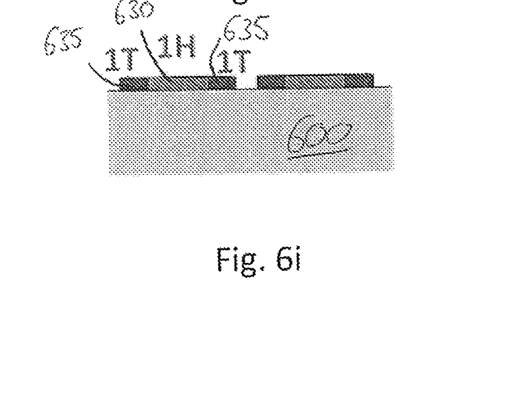
Figure 6J:
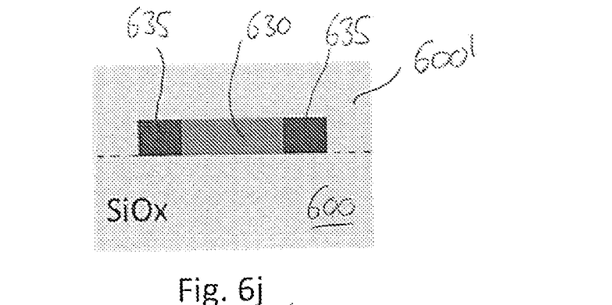
Figure 6K:
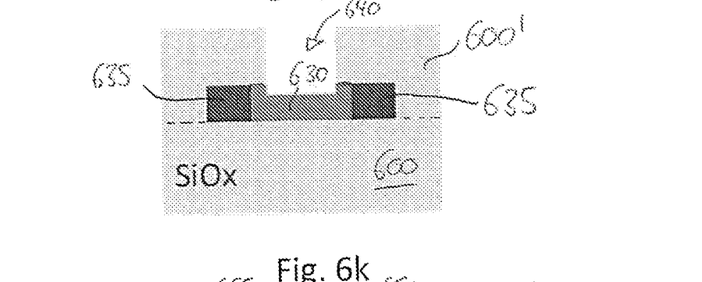
Figure 6L:
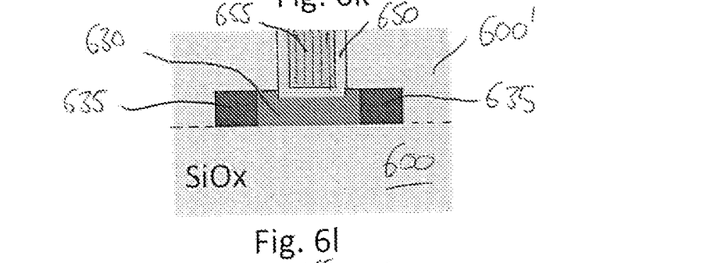
Figure 6M:
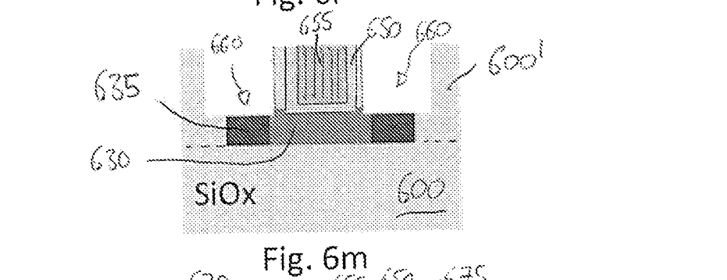
Figure 6N:
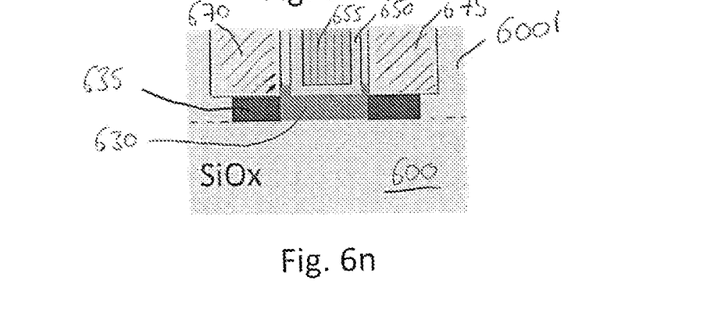

FIGS. 6a-n show an example of forming a heterojunction crystal structure, and forming a thin film crystal transistor using the heterojunction crystal structure. A thin film crystal of different phases may be grown or formed. The structures in FIGS. 6a-n are shown in a cross-sectional side view. A transistor of the integrated circuit as shown in FIG. 1 and/or FIG. 2 may be formed as described in connection with FIGS. 6a to 6n.

FIG. 6a shows an electrically insulating structure 600, for example an inter-layer dielectric ILD, with a first metal layer 610 formed (e.g. deposited) on the ILD. For example, metal patterning on the ILD is performed. The first metal layer 610 comprises a first metal. According to FIG. 6b, a mask layer 620 is formed and structured (e.g. by hard mask patterning) to cover first portions of the first metal layer 610.

The first metal layer 610 may be etched to remove the parts of the metal layer 610 not being covered by the mask layer 620, as shown in FIG. 6c. A further mask layer 625 is formed (see FIG. 6d) and structured so that portions of the further mask layer 625 are located laterally between the remaining portions of the metal layer 610, with a predefined distance from the remaining portions of the metal layer 610.

FIG. 6e shows metal deposition on the structure shown in FIG. 6d, for forming a second metal layer 615. The second metal layer 615 comprises a second metal differing from the first metal of the first metal layer 610. The second metal layer 615 may have a thickness smaller than a thickness (e.g. a height) of the first metal layer 610. The second metal layer 615 may cover portions of the electrically insulating structure 600 uncovered by the first structured metal layer 610. The second metal layer 615 may be formed adjacent to the remaining portions of the first metal layer 610. As a result, heterojunction metal portions may be formed on the electrically insulating structure 600. The heterojunction metal portions are separated from each other laterally by the mask layer 625.

As shown in FIG. 6f, a sacrificial layer 640 may be formed on the second metal layer 615. The shown structure may be planarized (e.g. by chemical mechanical polishing CMP) to remove parts of the second metal layer 615, the mask layer 620, and/or an upper portion of the first structured metal layer 610, for example, together with the sacrificial layer 640. As a result, heterojunction metal structures with a thickness of less than a thickness of the second metal layer 615 may remain. After polishing, the uncovered heterojunction metal portions remaining on the electrically insulating structure 600 may have a thickness (e.g. a height) of less than 10 nm, for example. The formed heterojunction metal portions may comprise portions of the first structured metal layer 610 and remaining portions of the second metal layer 615 in a common layer separated from each other by the mask layer 625 (see FIG. 6g).

According to FIG. 6h, the mask layer 625 may be removed so that detached heterojunction metal portions comprising a centered portion of the first metal and edge portions of the second metal are formed on the electrically insulating layer 600.

Subsequently, the heterojunction metal portions may be heated in a gas atmosphere for conversion to thin film crystals. The first metal may transform in a first thin film crystal of a first crystal phase and the second metal may transform into a second thin film crystal of second crystal phase. Accordingly, FIG. 6i shows a heterojunction thin film crystal portion on the electrically insulating structure 600 comprising portions of first thin film crystal material 630 next to portions of second thin film crystal material 635. According to the proposed example, the heterojunction metal portion may be transformed into a heterojunction thin film crystal portion simultaneously using a common gas atmosphere. Atoms of the common gas atmosphere may cause transformation of the first metal of the structured metal layer 610 into the first thin film crystal material 630, e.g. having an H-phase crystal structure; and transformation of the second metal of the second metal layer 615 into the second thin film crystal material 635, e.g. having a T-phase crystal structure. The type of achieved thin film crystal material and crystal structure may depend on the materials of the metal layers and on the composition of the gas atmosphere used for heating the heterojunction metal layer, for example.

FIGS. 6j to 6n show an example of forming a thin film crystal transistor using the provided thin film crystal portion. The proportions of FIGS. 6j to 6n may differ from the proportions of FIGS. 6a to 6i.

According to FIG. 6j, an ILD layer 600' is formed on the thin film crystal portions comprising first and second thin film crystal material 630, 635 so that the thin film crystal portions are completely covered by insulating material, for example silicon oxide material.

FIG. 6k shows gate patterning by forming a mask layer and structuring the ILD layer 600'. In a lateral center region of the thin film crystal portion having the first crystal material 630, the ILD layer 600' is etched to uncover at least a top surface of the thin film crystal portion having the first thin film crystal material 630 so that a trench 640 is provided in the ILD layer 600'. For example, also an upper portion of the thin film crystal material 630 may be slightly etched within the center region.

According to FIG. 6l, a gate structure of the transistor to be formed is provided. For example, a high-K dielectric material 650 (e.g. hafnium oxide) is deposited onto the ILD layer 600' and into the trench 640 to cover the bottom and the side walls of the trench and to form a gate insulation layer on the thin film crystal material 630. Further, a metal gate fill or polysilicon fill is formed in the trench to provide a gate electrode 655 on the gate dielectric 650. Afterwards, portions of the high-K dielectric material and the metal gate fill are removed and the surface is planarized (e.g. by chemical mechanical polishing CMP).

Further, a mask layer is formed on the ILD layer 600' for etching contact openings 660 into the ILD layer 600' in two portions of the ILD layer 600' at opposite sides of the gate structure. For example, surfaces of the thin film crystal layer 630 are uncovered (see FIG. 6m), for providing a drain region and a source region of the transistor to be formed. Subsequently, according to FIG. 6n, a source and a drain structure are formed, for example by depositing metal in the contact openings and planarizing the surface. A first metal structure 670 may be a drain structure of the transistor and a second metal structure 675 may be a source structure of the transistor. Further, a top surface of the shown structure comprising the formed thin film crystal transistor may be polished to provide a flat surface of the structure above the heterojunction thin film crystal portion.

As can be seen in FIG. 6n, the formed thin film crystal portion provides both a channel region (e.g. having an H-phase crystal structure), and a source/drain region (e.g. having a T-phase crystal structure) of the transistor, for example.

More details and aspects are mentioned in connection with the embodiments described above or below. The embodiments shown in FIGS. 6a to 6n may comprise one or more optional additional features corresponding to one or more aspects mentioned in connection with the proposed concept or one or more embodiments described above or below (e.g. FIGS. 1 to 5d and 7a-8).

FIGS. 7a-m show an example of forming a heterojunction crystal structure comprising a semiconducting portion and a metallic portion. The structures in FIGS. 7a-7m are shown in a cross-sectional side view. Heterojunction crystal portions may be formed that can be further processed (e.g. according to examples shown in FIGS. 6j-6n) for forming thin film crystal transistors, for example.

FIGS. 7a to 7m show an example of forming thin film crystal portions, e.g. for forming a transistor. For forming the thin film crystal portions, a thin metal layer may be deposited using chemical vapor deposition, for example. Afterwards, the metal layer may be transformed into a thin film crystal layer by heating the metal layer in a gas atmosphere. The manufacturing process shown in FIGS. 7a to 7m may be used to form an integrated circuit as shown in FIGS. 1 and 2, for example.

Figure 7A:
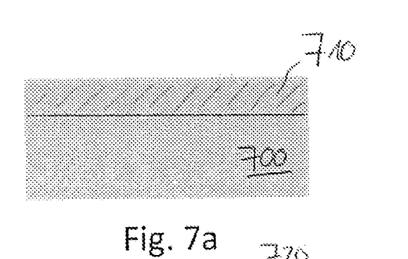
FIGS. 7*a*-7*m* show an example of forming a heterojunction crystal structure comprising a semiconducting portion and a metallic portion.

FIG. 7a shows an example of metal patterning on an electrically insulating structure 700, for example an ILD (e.g. silicon oxide $SiO_x$ or silicon nitride). A metal layer 710 may be formed and structured on the electrically insulating structure 700. The metal layer 710 may be formed by means of chemical vapor deposition, for example. The metal layer 710 may be formed with a thickness smaller than 10 nm, for example.

Figure 7B:
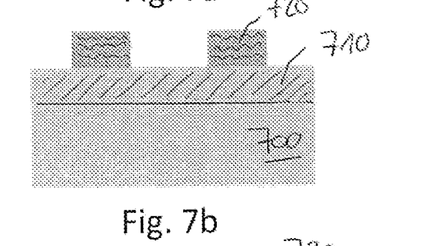
Figure 7C:
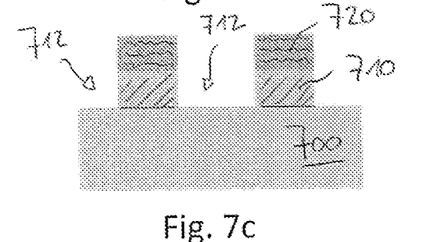
Figure 7D:
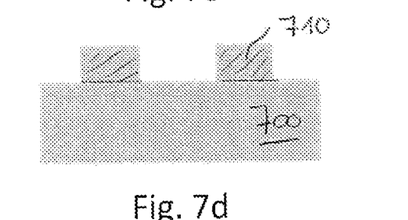

FIG. 7b shows hard mask patterning on the metal layer 710. A mask layer 720 is formed on the metal layer 710, for example. Further, a metal etch is performed to remove the metal layer 710 in regions 712 not being covered by the mask layer 720 (see FIG. 7c). Subsequently, according to FIG. 7d, the hard mask 720 is removed, for example using dry etch, wet etch, and/or ash techniques.

Figure 7E:
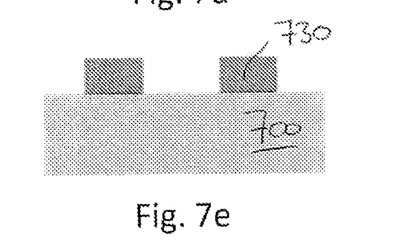

FIG. 7e shows the result of a conversion of the structured metal layer 710 into a thin film crystal or thin film crystal layer 730 using gases and heat. As described in methods above or below, the deposited metal layer may be heated in a gas atmosphere to transform the metal layer into a thin film crystal layer. For example, the metal layer may comprise molybdenum and the gas atmosphere may comprise $H_2S$ or $H_2Te$. As a result of the heating, the sulfur or tellurium of the gas atmosphere may be incorporated into the metal layer so that the metal layer transforms into a thin film crystal layer, for example a molybdenum disulfide $MoS_2$ layer or a molybdenum ditelluride $MoTe_2$ layer. The thin film crystal layer may have an H-phase crystal structure, for example (semiconducting thin film crystal).

Figure 7F:
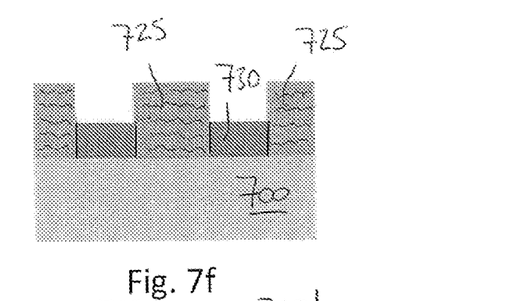
Figure 7G:
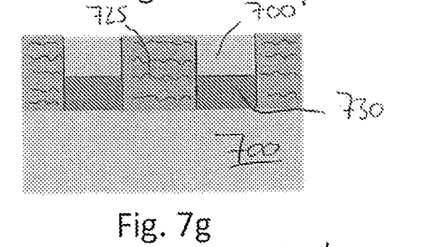
Figure 7H:
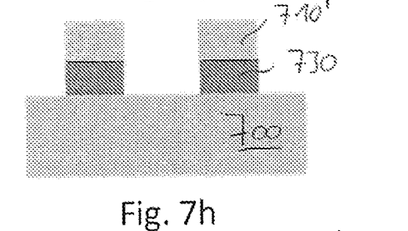
Figure 7I:
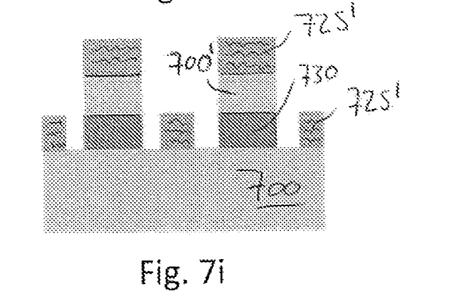

According to FIG. 7f, a further mask layer 725 is formed on the electrically insulating layer 700 to form trenches on the portions of the thin film crystal layer 730. Further, an ILD 700' is formed on the thin film crystal layer 730. The structure is planarized so that the trenches of the further mask layer 725 are filled with material of the ILD 700' (or alternatively with a temperature resistant polymer, e.g.) (as shown in FIG. 7g). According to FIG. 7h, the further mask layer 725 is removed, e.g. by etching.

Figure 7J:
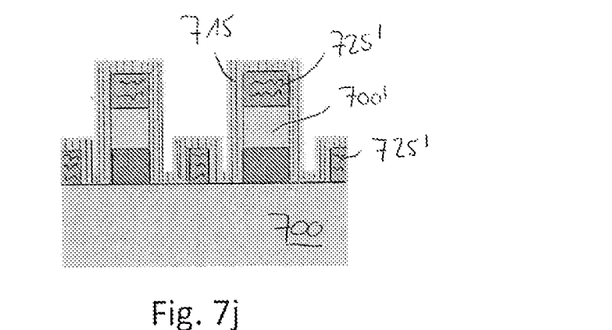
Figure 7K:
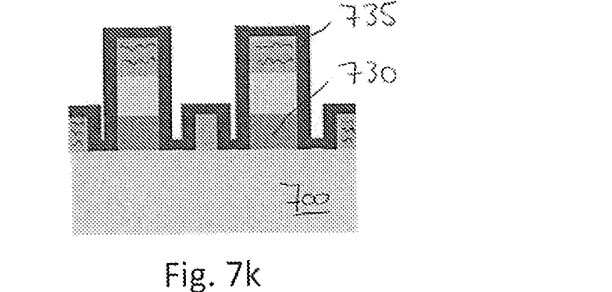
Figure 7L:
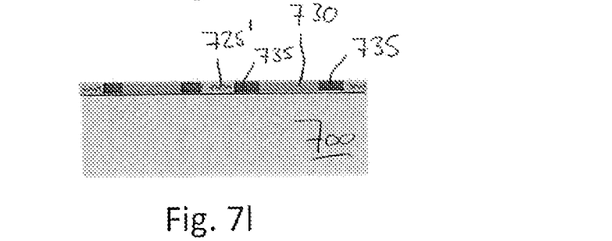

A second mask layer 725' is formed (see FIG. 7i) laterally between the portions of the thin film crystal layer 730, with a predefined distance from the portions. FIG. 7j shows metal deposition on the structure shown in FIG. 7i, for forming a second metal layer 715, comprising a second metal differing from the first metal of the first metal layer 710. The second metal layer 715 may have a thickness smaller than a thickness of the first metal layer 710. For example, a thickness of the second metal layer 715 may be less than 10 nm. The second metal layer 715 may cover portions of the electrically insulating structure 700 uncovered by the first structured metal layer 710 (and uncovered by the second mask layer 725'). The second metal layer 715 may be formed adjacent to the portions of the thin film crystal layer 730.

Subsequently, the second metal layer 715 may be transformed into a second thin film crystal layer 735. Transforming the second metal layer 715 may be achieved by heating the structure in a gas atmosphere. The second thin film crystal layer 735 may have a T-phase structure (e.g. of a metallic thin film crystal).

For example, a sacrificial layer may be formed on the second thin film crystal layer 735. The structure may be polished (e.g. by chemical mechanical polishing CMP) to remove parts of the second thin film crystal layer 735, the second mask layer 725', and/or an upper portion of the first thin film crystal layer 730, for example, together with the sacrificial layer. After polishing, uncovered heterojunction thin film crystal portions remaining on the electrically insulating structure 700 may have a thickness of less than 10 nm, for example. The formed heterojunction thin film crystal portions may each comprise a centered portion of H-phase thin film crystal 730, and edge portions of T-phase thin film crystal 735. The heterojunction thin film crystal portions are located in a common layer and separated from each other by the remaining portions of the mask layer 725' (see FIG. 7l).

Figure 7M:
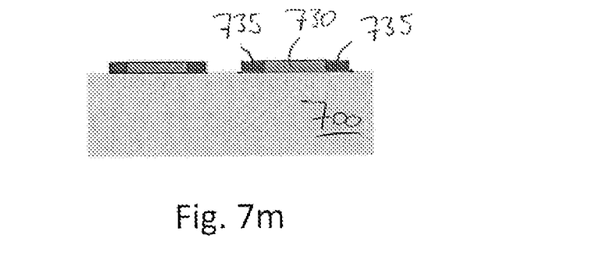

As shown in FIG. 7m, the mask layer 725' may be removed to separate the formed heterojunction thin film crystal portions (similar to the thin film crystal portions as shown in FIG. 6i, for example).

More details and aspects are mentioned in connection with the embodiments described above or below. The embodiments shown in FIGS. 7a to 7m may comprise one or more optional additional features corresponding to one or more aspects mentioned in connection with the proposed concept or one or more embodiments described above or below (e.g. FIGS. 1 to 6n or FIG. 8).

Figure 8:
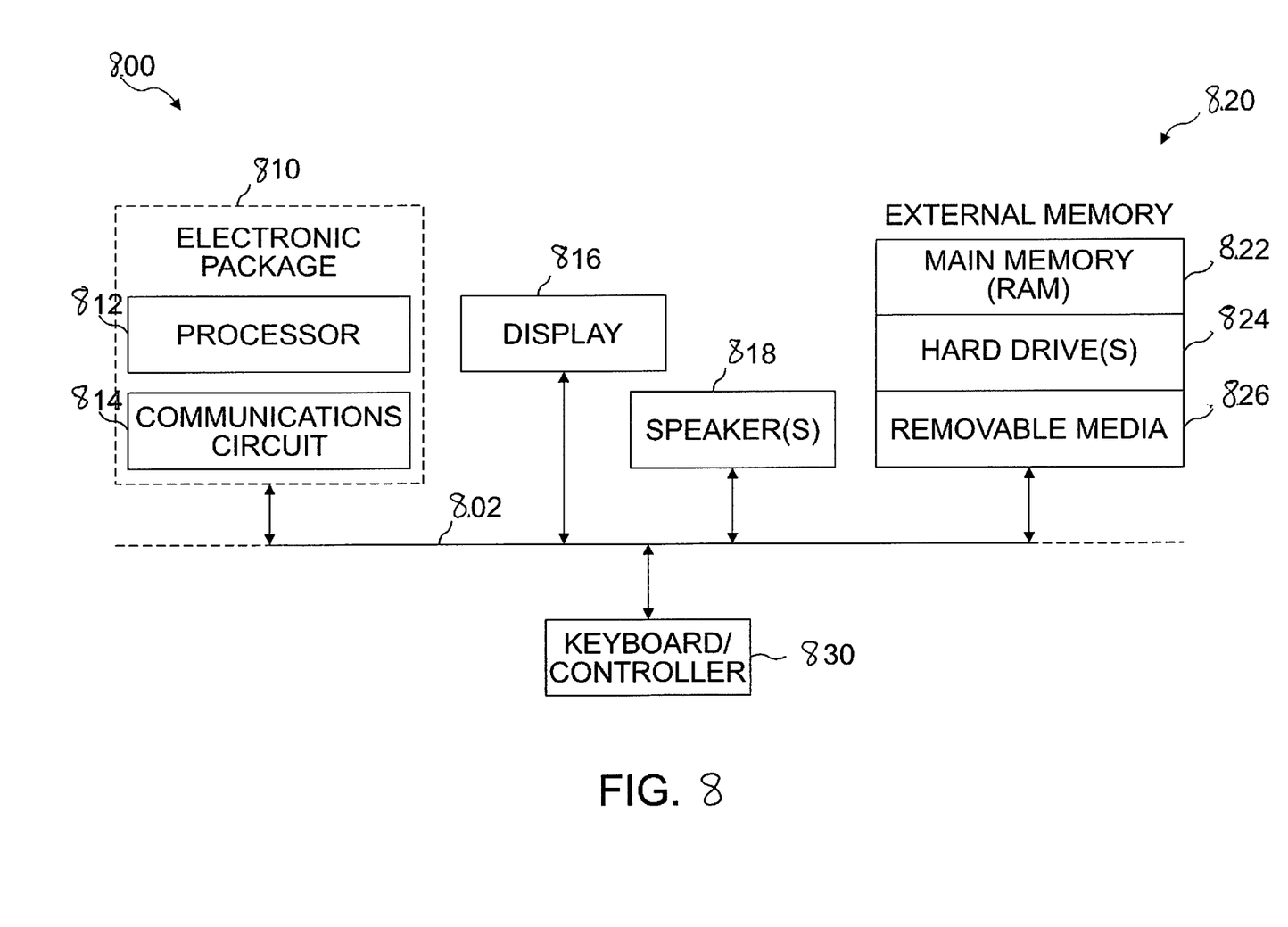
FIG. 8 shows an example of a system comprising an integrated circuit.

FIG. 8 is a block diagram of an electronic apparatus 800 (e.g. a computing system or computing device) incorporating at least one electronic assembly, e.g. integrated circuit 100, described herein. Electronic apparatus 800 is-merely one example of an electronic apparatus in which forms of the electronic assemblies described herein may be used. Examples of an electronic apparatus 800 include, but are not limited to, personal computers, tablet computers, mobile telephones, game devices, MP3 or other digital music players, etc. In this example, electronic apparatus 800 comprises a data processing system that includes a system bus 802 to couple the various components of the electronic apparatus 800. System bus 802 provides communications links among the various components of the electronic apparatus 800 and may be implemented as a single bus, as a combination of busses, or in any other suitable manner.

An electronic assembly 810 as describe herein may be coupled to system bus 802. The electronic assembly 810 may include any circuit or combination of circuits. In one embodiment, the electronic assembly 810 includes a processor 812 (e.g. integrated circuit 100) which can be of any type. As used herein, "processor" means any type of computational circuit, such as but not limited to a microprocessor, a microcontroller, a complex instruction set computing (CISC) microprocessor, a reduced instruction set computing (RISC) microprocessor, a very long instruction word (VLIW) microprocessor, a graphics processor, a digital signal processor (DSP), multiple core processor, or any other type of processor or processing circuit.

Other types of circuits that may be included in electronic assembly 810 are a custom circuit, an application-specific integrated circuit (ASIC), or the like, such as, for example, one or more circuits (such as a communications circuit 814) for use in wireless devices like mobile telephones, tablet computers, laptop computers, two-way radios, and similar electronic systems. The IC can perform any other type of function.

The electronic apparatus 800 may also include an external memory 820, which in turn may include one or more memory elements suitable to the particular application, such as a main memory 822 in the form of random access memory (RAM), one or more hard drives 824, and/or one or more drives that handle removable media 826 such as compact disks (CD), flash memory cards, digital video disk (DVD), and the like.

The electronic apparatus 800 may also include a display device 816, one or more speakers 818, and a keyboard and/or controller 830, which can include a mouse, trackball, touch screen, voice-recognition device, or any other device that permits a system user to input information into and receive information from the electronic apparatus 800.

Examples relate to concepts for lowering contact resistance for thin film crystals.

Further examples relate to further aspects of the present disclosure.

Example 1 relates to an integrated circuit comprising: a semiconductor substrate; a wiring layer stack located on the semiconductor substrate; and a transistor embedded in the wiring layer stack, wherein the transistor comprises an embedded layer, wherein the embedded layer has a thickness of less than 10 nm, wherein the embedded layer comprises at least one two-dimensional crystalline layer comprising more than 10% metal atoms.

Example 2 relates to the integrated circuit according to example 1, wherein the embedded layer is a thin film crystal layer.

Example 3 relates to the integrated circuit according to example 2, wherein the thin film crystal layer comprises less than 20 two-dimensional crystalline monolayers.

Example 4 relates to the integrated circuit according to example 2 or 3, wherein a first portion of the thin film crystal layer is a channel region of the transistor and a second portion of the thin film crystal layer is a source region of the transistor.

Example 5 relates to the integrated circuit according to example 4, wherein at least the first portion of the thin film crystal layer has a first crystal phase, and wherein the second portion of the thin film crystal layer has a second crystal phase differing from the first crystal phase.

Example 6 relates to the integrated circuit according to example 5, wherein the first crystal phase is an H-phase and the second crystal phase is a T-phase.

Example 7 relates to the integrated circuit according to example 5 or 6, wherein at least 70% of the material of the second portion has a T-phase crystal structure.

Example 8 relates to the integrated circuit according to one of examples 2 to 7, wherein the thin film crystal layer comprises at least 10% of metal atoms, wherein the metal atoms are Sc, Ti, V, Cr, Mn, Fe, Co, Ni, Cu, Zn, Y, Zr, Nb, Mo, Tc, Ru, Rh, Pd, Ag, Cd, Hf, Ta, W, Re, Os, Ir, Pt, Au, Hg, Rf, Db, Sg, Bh, Hs, Mt, Ds, or Rg.

Example 9 relates to the integrated circuit according to one of examples 2 to 8, wherein the thin film crystal layer comprises at least 10% of secondary atoms, wherein the secondary atoms are S, Cl, H, O, Se, or Te.

Example 10 relates to the integrated circuit according to one of examples 2 to 9, wherein the thin film crystal layer comprises at least 10% of tertiary atoms, wherein the tertiary atoms are S, Cl, H, O, Se, or Te.

Example 11 relates to the integrated circuit according to one of examples 2 to 10, wherein the thin film crystal layer comprises one of $MoS_2$, $MoTe_2$, or $Ti_2SC$, $Ti_2CdC$, $Hf_2InC$, $Hf_2SSc$, or $Ti_3SiC_2$.

Example 12 relates to the integrated circuit according to one of examples 2 to 11, wherein the thin film crystal layer is a transition metal dichalcogenide layer.

Example 13 relates to the integrated circuit according to one of examples 4 to 12, wherein the transistor comprises a gate dielectric layer and a gate electrode, wherein the gate dielectric layer is located between the first portion of the thin film crystal layer and the gate electrode.

Example 14 relates to the integrated circuit according to one of examples 6 to 13, wherein the transistor comprises a source metal contact structure electrically connected to the second portion of the thin film crystal layer.

Example 15 relates to an integrated circuit comprising: a plurality of thin film crystal transistors located on a substrate; and an electrically insulating layer, wherein gates of the plurality of thin film crystal transistors are located between the substrate and the electrically insulating layer.

Example 16 relates to the integrated circuit according to example 15, wherein the substrate is a semiconductor substrate, wherein a portion of the substrate is a doped region of a further transistor of the integrated circuit.

Example 17 relates to the integrated circuit according to example 15 or 16, wherein the electrically insulating layer is an inter-layer dielectric layer of the integrated circuit.

Example 18 relates to the integrated circuit according to one of examples 15 to 17 wherein the thin film crystal transistor comprises a thin film crystal layer.

Example 19 relates to the integrated circuit according to example 18, wherein the thin film crystal layer less than 20 two-dimensional crystalline monolayers.

Example 20 relates to the integrated circuit according to example 18 or 19, wherein a first portion of the thin film crystal layer is a channel region of the thin film crystal transistor.

Example 21 relates to the integrated circuit according to example 20, wherein at least the first portion of the thin film crystal layer has a first crystal phase.

Example 22 relates to the integrated circuit according to example 21, wherein a second portion of the thin film crystal layer is a source region of the transistor, wherein the second portion of the thin film crystal layer has a second crystal phase differing from the first crystal phase.

Example 23 relates to the integrated circuit according to example 22, wherein the first crystal phase is an H-phase and the second crystal phase is a T-phase.

Example 24 relates to the integrated circuit according to example 22 or 23, wherein at least 70% of the second portion has a T-phase crystal structure.

Example 25 relates to the integrated circuit according to one of examples 18 to 24, wherein the thin film crystal layer comprises at least 10% of metal atoms, wherein the metal atoms are Sc, Ti, V, Cr, Mn, Fe, Co, Ni, Cu, Zn, Y, Zr, Nb, Mo, Tc, Ru, Rh, Pd, Ag, Cd, Hf, Ta, W, Re, Os, Ir, Pt, Au, Hg, Rf, Db, Sg, Bh, Hs, Mt, Ds, or Rg.

Example 26 relates to the integrated circuit according to one of examples 18 to 25, wherein the thin film crystal layer comprises at least 10% of secondary atoms, wherein the secondary atoms are S, Cl, H, O, Se, or Te.

Example 27 relates to the integrated circuit according to one of examples 18 to 26, wherein the thin film crystal layer comprises at least 10% of tertiary atoms, wherein the tertiary atoms are S, Cl, H, O, Se, or Te.

Example 28 relates to the integrated circuit according to one of examples 18 to 27, wherein the thin film crystal layer comprises one of $MoS_2$, $MoTe_2$, $Ti_2SC$, $Ti_2CdC$, $Hf_2InC$, $Hf_2SSc$, or $Ti_3SiC_2$.

Example 29 relates to the integrated circuit according to one of examples 18 to 28, wherein the thin film crystal layer is a transition metal dichalcogenide layer.

Example 30 relates to the integrated circuit according to one of examples 20 to 29, wherein the thin film crystal transistor comprises a gate dielectric layer and a gate electrode, wherein the gate dielectric layer is located between the first portion of the thin film crystal layer the gate electrode.

Example 31 relates to the integrated circuit according to one of examples 22 to 30, wherein the thin film crystal transistor comprises a source metal contact structure located on the second portion of the thin film crystal layer.

Example 32 relates to a method for forming an integrated circuit, the method comprising: forming a first portion of a wiring layer stack of the integrated circuit on a semiconductor substrate of the integrated circuit; forming a transistor on the first portion of the wiring layer stack, wherein forming the transistor comprises forming an embedded layer of the transistor, wherein the embedded layer has a thickness of less than 10 nm, wherein the embedded layer comprises at least one two-dimensional crystalline layer comprising more than 10% metal atoms; and forming a second portion of the wiring layer stack on the transistor so that the transistor is embedded in the wiring layer stack.

Example 33 relates to the method according to example 32, wherein the embedded layer is a thin film crystal layer.

Example 34 relates to the method according to example 33, further comprising converting a crystal phase of at least a portion of the thin film crystal layer from a first crystal phase into a second crystal phase.

Example 35 relates to the method according to example 34, wherein the crystal phase is converted by at least one of chemical treatment, laser treatment or electron beam treatment of the portion of the thin film crystal layer.

Example 36 relates to the method according to example 33, wherein forming the thin film crystal layer comprises: forming a layer comprising at least a first and a second portion of different metals; and heating the layer in a gas atmosphere to transform the metal of the first portion into a thin film crystal material having a first crystal phase and the metal of the second portion into a thin film crystal material having a second crystal phase.

Example 37 relates to the method according to example 33, wherein forming the thin film crystal layer comprises: forming first metal portions of a metal in a layer and transforming the metal of the first met-al portions into thin film crystal material having a first crystal phase; and forming second metal portions of the metal in the layer next to the first metal portions and transforming the metal of the second metal portions into thin film crystal material having a second crystal phase, so that the formed thin film crystal layer has portions comprising the crystal material having the first crystal phase adjacent to portions comprising the crystal material having the second crystal phase.

Example 38 relates to the method according to one of examples 34 to 37, wherein the first crystal phase is an H-phase, and the second crystal phase is a T-phase.

Example 39 relates to the method according to one of examples 34 to 38, further comprising: forming a gate dielectric of a gate of the transistor on the portion of the thin film crystal layer having the first crystal phase; and forming a gate electrode on the gate dielectric.

Example 40 relates to the method according to one of examples 34 to 39, further comprising forming a source metal contact structure on a portion of the thin film crystal layer having the second crystal phase.

Example 41 relates to the method according to one of examples 39 or 40, wherein forming the second portion of the wiring layer stack comprises forming an electrically insulating layer on the gate of the transistor.

Example 42 relates to the method according to one of examples 33 to 41, wherein the thin film crystal layer comprises at least 10% of metal atoms, wherein the metal atoms are Sc, Ti, V, Cr, Mn, Fe, Co, Ni, Cu, Zn, Y, Zr, Nb, Mo, Tc, Ru, Rh, Pd, Ag, Cd, Hf, Ta, W, Re, Os, Ir, Pt, Au, Hg, Rf, Db, Sg, Bh, Hs, Mt, Ds, or Rg.

Example 43 relates to the method according to one of examples 33 to 42, wherein the thin film crystal layer comprises at least 10% of secondary atoms, wherein the secondary atoms are S, Cl, H, O, Se, or Te.

Example 44 relates to the method according to one of examples 33 to 43, wherein the thin film crystal layer comprises at least 10% of tertiary atoms, wherein the tertiary atoms are S, Cl, H, O, Se, or Te.

Example 45 relates to the method according to one of examples 33 to 44, wherein the thin film crystal layer comprises one of $MoS_2$, $MoTe_2$, $Ti_2SC$, $Ti_2CdC$, $Hf_2InC$, $Hf_2SSc$, or $Ti_3SiC_2$.

Example 46 relates to the method according to one of examples 33 to 45, wherein the thin film crystal layer is a transition metal dichalcogenide layer.

Example 47 relates to a method for forming an integrated circuit, the method comprising: forming a plurality of thin film crystal transistor on a substrate; and forming an electrically insulating layer on gates of the plurality of thin film crystal transistors.

Example 48 relates to the method according to example 47, wherein the substrate is a semiconductor substrate, wherein a portion of the substrate is a doped region of a further transistor of the integrated circuit.

Example 49 relates to the method according to example 47 or 48, wherein the thin film crystal transistor is formed above at least one further transistor structure of the integrated circuit.

Example 50 relates to the method according to one of examples 47 to 49, wherein the thin film crystal transistor comprises a thin film crystal layer.

Example 51 relates to the method according to example 50, wherein the thin film crystal layer comprises less than 20 two-dimensional crystalline monolayers.

The aspects and features mentioned and described together with one or more of the previously detailed examples and figures, may as well be combined with one or more of the other examples in order to replace a like feature of the other example or in order to additionally introduce the feature to the other example.

The description and drawings merely illustrate the principles of the disclosure. Furthermore, all examples recited herein are principally intended expressly to be only for illustrative purposes to aid the reader in understanding the principles of the disclosure and the concepts contributed by the inventor(s) to furthering the art. All statements herein reciting principles, aspects, and examples of the disclosure, as well as specific examples thereof, are intended to encompass equivalents thereof.

It is to be understood that the disclosure of multiple acts, processes, operations, steps or functions disclosed in the specification or claims may not be construed as to be within the specific order, unless explicitly or implicitly stated otherwise, for instance for technical reasons. Therefore, the disclosure of multiple acts or functions will not limit these to a particular order unless such acts or functions are not interchangeable for technical reasons. Furthermore, in some examples a single act, function, process, operation or step may include or may be broken into multiple sub-acts, -functions, -processes, -operations or -steps, respectively. Such sub acts may be included and part of the disclosure of this single act unless explicitly excluded.

Furthermore, the following claims are hereby incorporated into the detailed description, where each claim may stand on its own as a separate example. While each claim may stand on its own as a separate example, it is to be noted that—although a dependent claim may refer in the claims to a specific combination with one or more other claims—other examples may also include a combination of the dependent claim with the subject matter of each other dependent or independent claim. Such combinations are explicitly proposed herein unless it is stated that a specific combination is not intended. Furthermore, it is intended to include also features of a claim to any other independent claim even if this claim is not directly made dependent to the independent claim.

What is claimed is:

1. A method for forming an integrated circuit, the method comprising:
    forming a first portion of a wiring layer stack of the integrated circuit on a semiconductor substrate of the integrated circuit;
    forming a transistor on the first portion of the wiring layer stack,
        wherein forming the transistor comprises forming an embedded layer of the transistor,
        wherein the embedded layer has a thickness of less than 10 nm,
        wherein the embedded layer comprises at least one two-dimensional crystalline layer comprising more than 10% metal atoms; and
    forming a second portion of the wiring layer stack on the transistor so that the transistor is embedded in the wiring layer stack.

2. The method according to claim 1,
    wherein the embedded layer is a thin film crystal layer.

3. The method according to claim 2, further comprising converting a crystal phase of at least a portion of the thin film crystal layer from a first crystal phase into a second crystal phase.

4. The method according to claim 3,
    wherein the crystal phase is converted by at least one of chemical treatment, laser treatment or electron beam treatment of the portion of the thin film crystal layer.

5. The method according to claim 2,
wherein forming the thin film crystal layer comprises:
forming a layer comprising at least a first and a second portion of different metals; and
heating the layer in a gas atmosphere to transform the metal of the first portion into a thin film crystal material having a first crystal phase and the metal of the second portion into a thin film crystal material having a second crystal phase.

6. The method according to claim 2,
wherein forming the thin film crystal layer comprises:
forming first metal portions of a metal in a layer and transforming the metal of the first metal portions into thin film crystal material having a first crystal phase; and
forming second metal portions of the metal in the layer next to the first metal portions and transforming the metal of the second metal portions into thin film crystal material having a second crystal phase, so that the formed thin film crystal layer has portions comprising the crystal material having the first crystal phase adjacent to portions comprising the crystal material having the second crystal phase.

* * * * *